United States Patent [19]

Dion

[11] Patent Number: 4,764,732

[45] Date of Patent: Aug. 16, 1988

[54] SWITCHABLE MODE AMPLIFIER FOR WIDE DYNAMIC RANGE

[75] Inventor: Bruno Dion, St-Eustache, Canada

[73] Assignee: General Electric Company, Fairfield, Conn.

[21] Appl. No.: 110,279

[22] Filed: Oct. 20, 1987

[30] Foreign Application Priority Data

Oct. 23, 1986 [GB] United Kingdom ............... 8625409

[51] Int. Cl.⁴ ............................................. H03F 3/08
[52] U.S. Cl. ................................. 330/59; 250/214 A; 330/110; 330/156; 330/278; 330/293; 330/300; 330/308
[58] Field of Search ................. 330/59, 110, 156, 278, 330/293, 300, 308; 250/214 A, 214 AG; 455/619; 307/311

[56] References Cited

U.S. PATENT DOCUMENTS

| | | | |
|---|---|---|---|
| 3,801,933 | 4/1974 | Teare | 330/277 |
| 3,927,383 | 12/1975 | Fjarlie et al. | 330/59 |
| 4,065,668 | 12/1977 | Monticelli | 250/214 |
| 4,075,576 | 2/1978 | Eden | 330/277 |
| 4,174,503 | 11/1979 | Merklinger et al. | 330/300 |
| 4,420,724 | 12/1983 | Owen | 330/300 X |
| 4,535,233 | 8/1985 | Abraham | 250/214 A |
| 4,555,623 | 11/1985 | Bridgewater et al. | 250/214 A |
| 4,563,656 | 1/1986 | Baum | 330/308 |
| 4,574,249 | 3/1986 | Williams | 330/59 |

Primary Examiner—James B. Mullins
Attorney, Agent, or Firm—Raymond A. Eckersley

[57] ABSTRACT

There is disclosed an amplifier device for use with a photodetector for amplifying wave energy signals received by the photodetector and converted into electrical signals. The amplifier device includes a first amplifier having its input connected to a junction between the photodetector and first and second photodetector load impedances. A negative feedback amplifier is connected to the output of the first amplifier. The negative feedback amplifier provides a feedback voltage to the first load impedance when in its first mode of operation and effectively reduces the voltage feedback to the first load impedance when in its second mode of operation. A switching device is provided to effectively switch the second load impedance in and out of circuit with the photodetector to effectively change the photodetector load impedance and alter the bias voltage to the feedback amplifier. As, a consequence, the feedback amplifier is able to operate in either of its first or second modes of operation respectively switching the amplifier device from a good sensitivity, broad bandwidth transimpedance amplifier to a follower amplifier of improved dynamic range.

16 Claims, 3 Drawing Sheets

SWITCHABLE MODE AMPLIFIER FOR WIDE DYNAMIC RANGE

The present invention relates to an amplifier for use in a receiver of an optical electric circuit. More specifically, the present invention relates to an amplifier that is switchable between a broad bandwidth transimpedance mode and a follower mode of improved dynamic range.

Amplifiers and preamplifiers of signals detected by transducers, particularly photodiodes, inherently include noise that effects the signal. Transducers such as germanium, silicon and InGaAs photodiodes have capacitance as their dominant impedance term. It is well known that the bandwidth of the amplifier is inversely proportional to the input capacitance and the load resistance of the transducer. It is desirable, therefore, to reduce the effective input capacitance as well as the load resistance to improve the operating bandwidth of the amplifier. These reductions however, effect both the noise performance and the response of the system.

A number of circuit arrangements have been devised to neutralize the effects brought about by input capacitances particularly in the low signal voltage input levels. One such circuit arrangement is disclosed in U.S. Pat. No. 3,927,383 issued Dec. 16, 1975 to Fjarlie et al. In the circuit arrangements disclosed, the photodiode is connected across the gate and source of a field effect transistor (FET). The source electrode of the FET is connected to the input of a negative feedback amplifier which feedbacks voltage through a load resistor connected to the gate of the FET. By connecting the photodetector across the gate and source electrodes of the FET a positive feedback is provided which neutralizes the input capacitance inherent in the photodetector by minimizing the voltage or potential variations across the photodetector due to the input wave energies applied to the photodetector. Further, the negative feedback reduces the effective impedance of the load resistor.

Another circuit arrangement is disclosed in U.S. Pat. No. 4,535,233 issued Aug. 13, 1985 to Abraham. The circuit disclosed therein is similar to that in U.S. Pat. No. 3,927,383 except that an additional buffer amplifier is provided after the feedback amplifier. While these transimpedance amplifiers have provided an amplifier having good sensitivity and broad bandwidth operation, these amplifiers have a limited dynamic range.

In accordance with one object of the present invention there is provided a amplifier suitable for use with a fibre optic receiver wherein the dynamic range of the amplifier is improved by switching from a low power transimpendace mode to a high power follower mode.

It is a further object of the present invention to provide a amplifier suitable for use in a fibre optic receiver which is switchable between a transimpedance mode and a follower amplifier mode.

In accordance with one aspect of the present invention there is provided an amplifier, switchable between a broad bandwidth transimpedance mode and an improved dynamic range follower mode, for amplifying wave energy signals received and converted to electrical signals by a transducer. The amplifier includes first amplifier means having an input coupled to a junction between the transducer, a first transducer load impedance means and a second transducer load impedance means where the second load impedance means is less than the first load impedance means. A second amplifier means is coupled to the output of the first amplifier means and has its output fedback to the input of the first amplifier through the first impedance means. The second amplifier means is operable in first and second modes respectively to provide voltage feedback to the input of the first amplifier through the first impedance means and to effectively reduce the voltage feedback to the input of the first amplifier means. A switch means is connected to the second load impedance means to switch the second load impedance means in and out of circuit with the transducer to effectively change the load impedance of the transducer and to respectively operate the second amplifier means in its first and second modes which respectively switches the amplifier between its transimpedance and follower modes of operation. The amplifier further includes an output means coupled to the output of the first amplifier means to provide an output signal in response to the receipt of the wave energy signals by the transducer.

It should be understood that the term "coupled", as used throughout the specification and claims, means that two components may be either directly connected to each other or indirectly connected through one or more intermediate components.

It should be understood that the term "follower mode" as used throughout the specification and claims, means a follower amplifier that may invert or not invert the signal.

Advantage is found by switching in the second transducer load impedance in and out of circuit. When the second transducer load impedance is switched into the circuit, this causes a reduction in the effective load resistance seen by the transducer which allows the amplifier to detect higher power signals and increase the dynamic range of the amplifier. The switching of the lower second load impedance in parallel with the higher first load impedance also changes the D.C. bias voltage applied through the first amplifier means to the second amplifier means. As a result in a change in the bias voltage applied to the second amplifier means the gain of the second amplifier means is substantially reduced or the second amplifier means may be switched off in its second mode of operation. As a result, the amplifier of the present invention changes from a transimpedance amplifier having good sensititivy over broad bandwidth operation to a follower amplifier of improved dynamic range. Thus, while the amplifier in its transimpedance mode tends to operate well at amplifying low power signals detected by the transducer this amplifier will not saturate when high power signals are received since the amplifier can be switched into its follower mode where the sensitivity of the amplifier is reduced and the power level required to saturate the amplifier is increased due to the change in the transducer load impedance. Thus, the amplifier because of its follower mode of operation is said to have an improved dynamic range.

For a better understanding of the nature and objects of the present invention reference may be had by way of example to the accompanying diagrammatic drawings in which.

Figure 1:
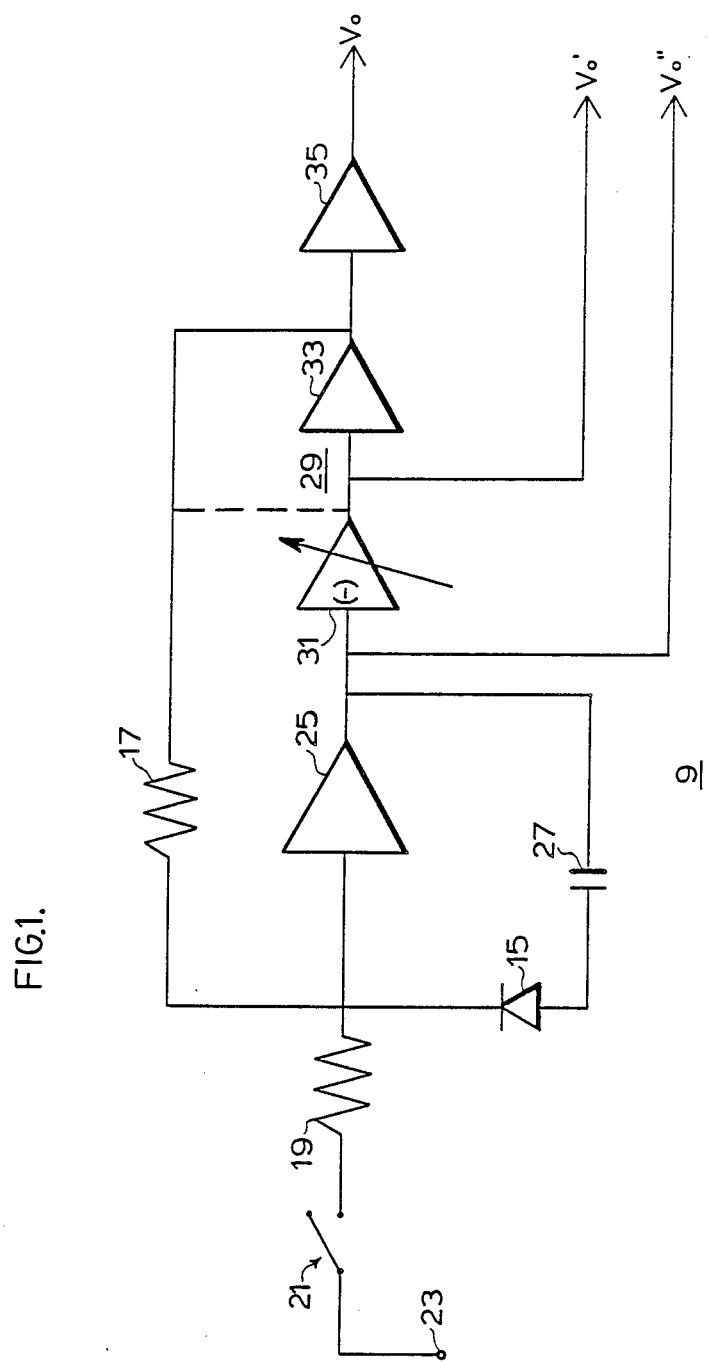
FIG. 1 is a schematic diagram of the wide dynamic range amplifier of the present invention.

FIG. 1 illustrates a schematic diagram of the switchable mode amplifier 9 of the present invention. The amplifier 9 includes a transducer in the form of a photodetector 15 for receiving energy signals and converting them to electrical signals. Connected to the output of the photodetector 15 is a first load impedance in the form of a feedback resistor 17 and a second load impedance in the form of a resistor 19 which can be switched in and out of circuit by switch means 21 connected to a suitable biasing potentital at 23.

The signal received and converted by transducer 15 is first passed through first amplifier means 25. The signal is positively coupled back through coupling capacitor 27 to the other side of the photodiode 15 so as to neutralize the input capacitance inherent in the photodetector 15 and thereby increase the bandwidth operation of the amplifier. The first amplifier means 25 is preferably a unity gain amplifier.

The signal is then fed from the first amplifier means 25 through a second amplifier means 29 which includes a variable gain inverting amplifier 31 and optionally a unity gain buffer amplifier 33. The signal can be fed back to the input of the first amplifier means 25 via resistor 17 from either amplifier 31 or optionally amplifier 33. Lastly, if desired the signal can pass through a further unity gain buffer amplifier 35. Thus the output signal can be taken optionally at outputs Vo, Vo' or Vo" depending on the operation of the circuit.

At low power signal reception, amplifier 9 operates as a transimpedance amplifier when switch means 21 is open as shown in FIG. 1. In this mode of operation the signal is fed back via feedback resistor 17 and the load impedance seen by the photodetector 15 is effectively that of the feedback resistor 17 divided by the combined gain of amplifier 25, 31 and 33.

At high power signal reception, amplifier 9 operates as a follower amplifier once resistor 19 is switched into the circuit by switch means 21 closing. Once resistor 19 is switched into the circuit the effective load impedance seen by photodetector 15 is resistor 19 in parallel with resistor 17. It should be understood that the value of resistor 19 is chosen to be less than that of resistor 17 and is preferably considerably less than that of resistor 17; at least two orders of magnitude. As a result, the load resistance seen by photodector 15 is reduced decreasing the output signal by 40 dB and thereby increasing the dynamic power range over which the amplifier may operate. It should be understood that the values of load resistors 17 and 19 can be chosen so that the amplifier 9 operates at desired gain/bandwidth requirements. Also, the DC bias potential applied through the first amplifier means 25 to the variable gain amplifier 31 changes when resistor 19 is switched into circuit. By changing the bias voltage applied to the variable gain amplifier 31, the gain of amplifier 31 may be reduced effectively reducing feedback through resistor 17 or the amplifier 31 may be turned off. In the event amplifier 31 is turned off, the output signal is taken at Vo". In the event gain is reduced from anywhere in the order of 10 to 50 to about 0.5, the output may be taken at Vo' or Vo. With this order of reduction in the gain, the dynamic range of the amplifier may be increased by as much as 40 dB.

Figure 2:
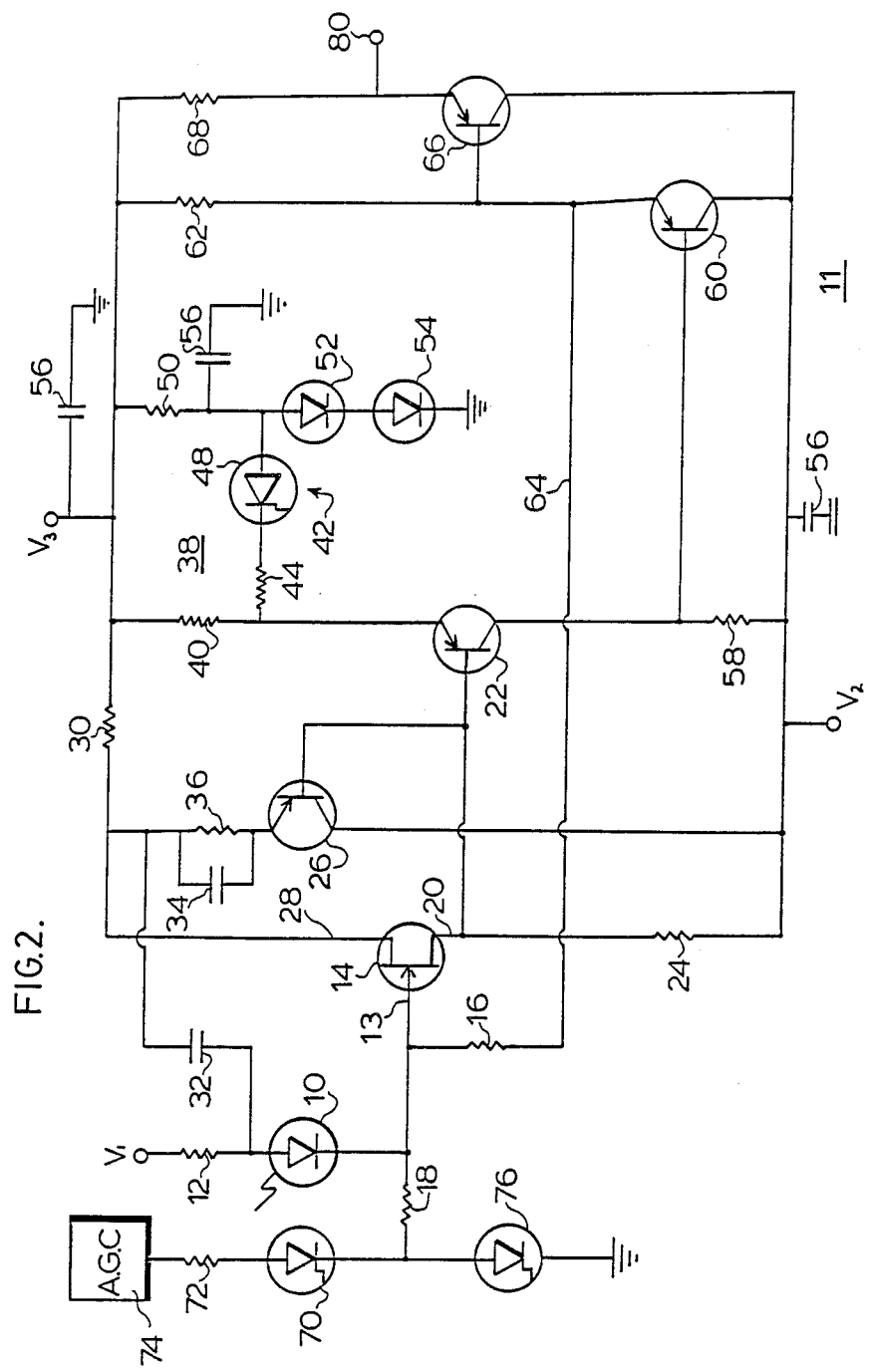
FIG. 2 is a circuit diagram of the preferred embodiment of the amplifier of the present invention.

Referring to FIG. 2 there is shown a preferred circuit for the wide dynamic range amplifier for receiving and amplifying wave energy signals. The amplifier shown generally at 11 includes a photodetector or diode 10 having its anode terminal connected to a bias voltage $V_1$ through a biasing resistor 12. The cathode of the photodiode 10 is connected to the gate electrode 13 of a first amplifying means preferrably comprising a field effect transistor (FET) 14. Also connected to the gate electrode 13 of FET 14 is a first load impedance or resistor 16 and a second load impedance or resistor 18. The source electrode 20 is connected to voltage potential $V_2$ via a biasing resistor 24. The source electrode 20 of FET 14 is further connected to the input of the second amplifier means comprising the base of a bipolar feedback transistor 22. The drain electrode 28 of FET 20 is connected to voltage potential $V_3$ through a suitable biasing resistor 30. Positive feedback is provided to the drain electrode 28 from source 20, amplifier 26 and filtering capacitor 34. The source electrode 20 of the FET 14 is also positively coupled to the anode of photodiode 10 through transistor 26, filtering capacitor 34 and biasing resistor 36, and filtering capacitor 32. This positive bootstrapping of the photodiode capacitance, gate to drain and gate to source capacitance of FET 14 to the anode of photodiode 10 effectively neutralizes the capacitance of the photodiode 10 and that developed across the gate to source of FET. Both FET 14 and the transistor amplifier 26 have gains approaching unity.

The second amplifying means or feedback amplifying means of the present invention is the circuitry associated with transistor 22. The transistor 22 has its gain controlled by a variable impedance circuit shown generally at 38. This impedance circuit 38 includes a parallel connection between a first resistor 40 and branch impedance 42. Branch impedance 42 includes a resistor 44 connected to the cathode of Shottky diode 48. The anode of Shottky diode 48 is connected through resistance 50 to the voltage supply $V_3$ and is connected to two commonly oriented series connected diodes 52 and 54. Diode 52 has its anode connected to the anode of the Shottky diode 48 and diode 54 has its cathode connected to ground. The capacitors shown generally at 56 throughout the circuit provide filtration and stability for the amplifier. The operation of circuit 38 will be described in more detail when the operation of the amplifier of FIG. 2 is described.

The collector of transistor 22 has a bias resistance 58 connected to the voltage supply $V_2$. The output of the signal is taken from the collector and enters through the base of transistor or unity gain buffer amplifier 60. The emitter of buffer amplifier 60 is suitably biased by resistance 62. A feedback path is provided to resistor 16 from the emitter of buffer amplifier 60 and the feedback path is shown generally by numeral 64. The emitter of amplifier or transistor 60 is connected to a further unity gain buffer amplifier 66. The buffer amplifier 66 has a bias resistor 68 associated therewith. The output 80 of the amplifier 11 is connected to the emitter of transistor 66.

Looking to the extreme left hand side of the circuit of FIG. 2 there is shown two Schottky diodes 70, 76 connected at their junction to second load resistance 18. These diodes constitute the sensitivity switching means in this embodiment of the invention. The first Schottky diode 70 has its anode connected through suitable biasing resistance 72 to a variable or automatic gain control (AGC) circuit 74. The cathode of diode 70 is connected to the anode of Schottky diode 76 and the second load resistance 18. The cathode of Schottky diode 76 is connected to ground potential.

Figure 3:
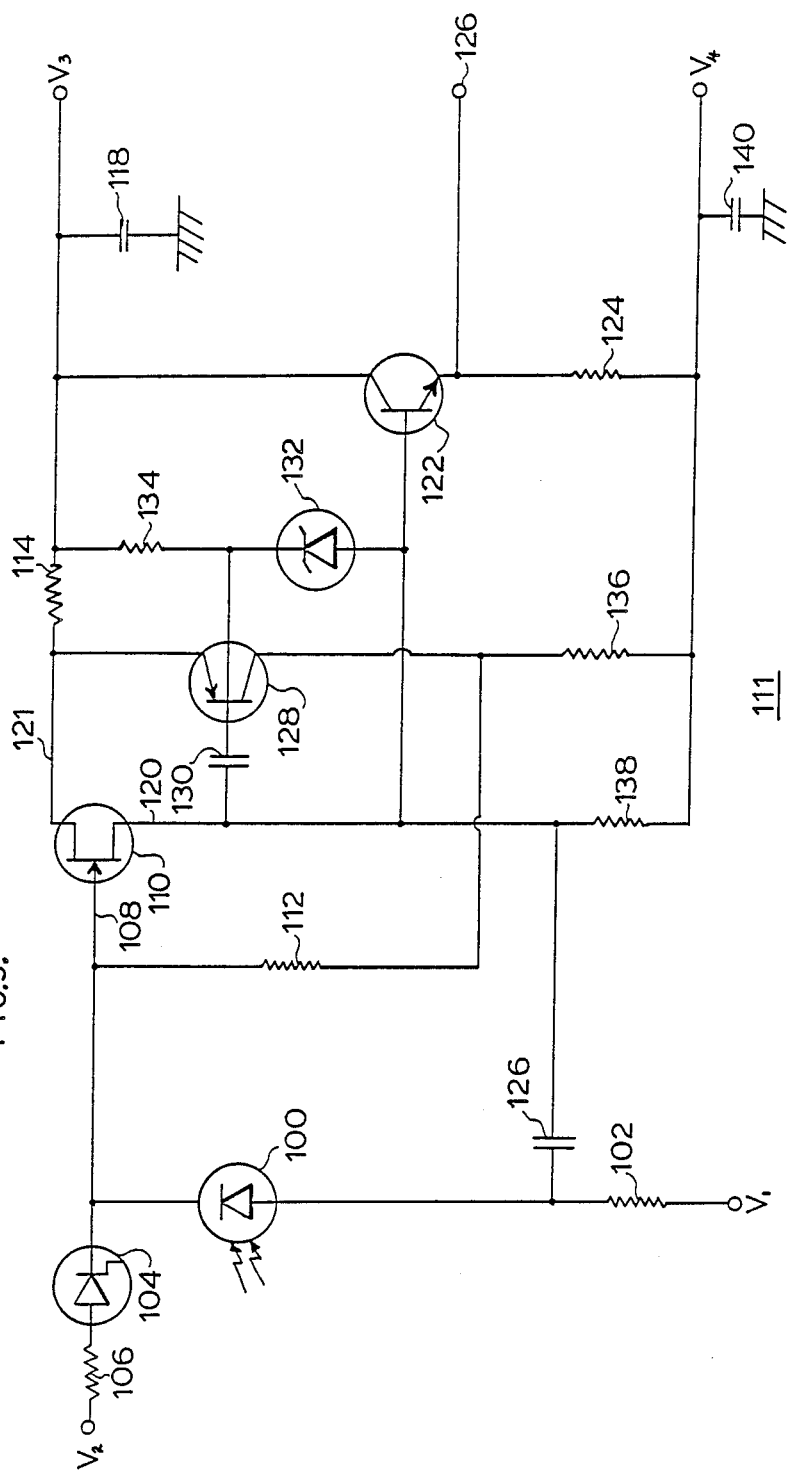
FIG. 3 is a circuit diagram of an alternate embodiment of the amplifier of the present invention.

It should be understood that standard component parts can be used for the circuitry shown in FIGS. 1, 2 and 3 and that the values of the components can be chosen so as to meet required gain and bandwidth requirements of the amplifier.

During the operation of the amplifier shown in FIG. 2, light wave energy impinging on the photodiode 10 is converted into electrical current. This signal is fed through the FET 14 which has approximately unity gain. The signal is then fed from the source 20 of the FET through the feedback amplifier system comprising transistors 22 and 60. Transistor 60 acts as a buffer buffering the feedback circuit from transistor 22. The signal is fed back through to the input or gate electrode of FET 14 along path 64 and resistance 16. The signal is also fed through transistor 66 to the output shown generally at 80. Transistor 66 basically acts as a buffer isolating the output from the remainder of the circuit. In this mode of operation when the signal is fed back through resistor 16, the amplifier 11 of FIG. 2 is operating as a transimpedance amplifier and the diodes 70 and 76 are operating as a switch which effectively maintains the resistance of the second load resistor 18 out of the circuit. The amplifier typically has a gain in the range of 20 to 35 decibels. The load resistance is determined by RCA 83,598 the effective resistance seen across resistor 16. Since FET 14 and amplifier 60 are unity gain amplifiers, the overall gain of the amplifier is determined for the most part by the gain associated with transistor 22. When the switch comprising diodes 70 and 76 has a low input at the voltage input 74, the diodes 70 and 76 are non-conducting making resistor 18 appear as an open circuit having an infinite load. This causes the bias voltage associated with transistor or feedback transistor 22 to be at a value that diode 48 of variable impedance circuit 38 is conducting. As a result, the gain associated with the transistor 22 will approximately equal the effective collector resistance divided by the effective emitter resistance. The emitter resistance will be resistor 40 in parallel with resistor 44 and the effective resistance of diode 48. Preferably, resistors 40 and 58 will be chosen to be in the same order of magnitude. Resistor 44 and the effective resistance of diode 48 may be considerably lower than that of resistor 40. Further, resistor 44 may not be needed. For example when resistor 40 is about 2200 ohms, resistor 44 is about 22 ohms, the diode 48 resistance is about 25 ohms and the resister 58 is about 1000 ohms the gain of transistor 22 will be about 22 when diode 48 conducts and about 0.45 when diode 48 does not conduct. It should be understood that the values of the components may be chosen such that the gain of transistor 22 is preferably in the range of 10 to 50 when diode 48 is conducting and is preferably about 0.45 when diode 48 is not conducting.

When the power of the signal received from the light impinging upon diode 10 increases to a value above a predetermined value sensed by the AGC circuit 74, the amplifier 11 is switched from its transimpedance mode to its follower mode of operation. The AGC applies a higher bias voltage to the diodes 70 and 76 causing conduction of the diodes. As a result the second impedance resistance 18 is connected to a virtual ground due to the conduction of diode 76. The second impedance 18 is now in circuit with the first load impedance 16. The second load impedance is preferably about 1 kilohm whereas the effective first load impedance is about 100 kilohms. A parallel combination of this circuit resistance will provide for an effective resistance for the photodiode 10 to be in the order 1 kilohm. The drop in effective photodetector load impedance acts to offset the rise in current generated by the photodetector due to increased energy signals impinging the photodetector. As a result the voltage output of the amplifier remains within acceptable limits.

Once the second load resistance 18 is connected in circuit, the DC bias voltage through the unity gain FET 14 to the base of transistor 22 increases. This causes the DC emitter voltage of transistor 22 to increase and causes diode 48 to become non-conducting removing resistor 44 from the circuit. As a result the effective emitter resistance of transistor 22 is increased and the gain of transistor 22 decreases to preferably about 0.45. This represents an overall gain in the dynamic range of about 25 to 40 dB. With the gain reduction of transistor 22, feedback through resistor 16 is reduced significantly. In effect the amplifier 11 operates as an inverting follower amplifier when transistor 22 operates in its second mode having reduced gain.

In summary, the circuit of FIG. 2 provides capacitive bootstrapping via transistor 26, so as to neutralize the capacitance associated with the photodiode 10. Further, due to the switching of diodes 70 and 76, the effective load resistance or impedance of the photodiode 10 is switched, the effective biasing of the amplifier is switched, and hence the sensitivity of the amplifier switched between transimpedance and follower modes switching its dynamic power range by about 40 dB.

Referring now to FIG. 3 there is shown an alternate circuit for realizing the present invention. The photodiode is shown generally at 100 and has its anode connected to a biasing voltage potential $V_1$ through a biasing resistor 102. The cathode of diode 100 is connected to the cathode of a switching diode or Schottky diode 104. A second load resistance 106 is provided suitably biased to a switching voltage potential $V_2$. In this embodiment diode 104 comprises the switching means of the present invention. The cathodes of diodes 100 and 104 are connected to the gate electrode 108 of unity gain FET transistor 110. The gate 108 of transistor 110 is coupled to a first load resistance 112 and to the second load impedance through diode 104.

The drain of FET 110 is connected through a suitable biasing resistor 114 to a biasing potential $V_3$. The biasing potential $V_3$ is provided with proper filter capacitance 118.

The source electrode 120 of FET 110 is connected directly to a unity gain buffer amplifier 122. The emitter of the buffer amplifier or transistor 122 has a suitable biasing resistor 124 which connects to a voltage source $V_4$. The output of the emitter of transistor 122 is taken at 126 and provides the output for the amplifier. The source 120 of FET 110 is coupled in a positive fashion through filtering capacitance 126 to the anode of photodiode 100. Coupled to the source electrode 120 is the base of amplifier transistor 128. The base of the transistor 128 is connected to the source via a parallel connection of a filter capacitor 130 and a Zener diode 132. Zener diode and the base of transistor 128 are suitably biased via a biasing resistor 134.

The collector and emitters of transistor 128 are suitably biased via respective resistors 136 and 114. The source 120 of FET 110 is biased to a voltage supply $V_4$ by resistance 138.

The operation of the amplifier shown in FIG. 3 normally operates as a transimpedance amplifier when diode 104 is in an open circuit mode. As a result the diode 100 load resistance is determined by load resistor 112. The signal received by diode 100 is converted into an electrical signal which passes the gate to source junction of FET 110 and out through the base emitter junction of transistor 122 to output 126. During this time feedback is provided via the Zener diode which is conducting in its reverse breakdown mode maintaining transistor 128 conducting to provide a feedback path through its collector and resistor 112.

The capacitance associated with the diode 100 and the gate to source capacitance of FET 110 is positively fed back through capacitor 126 to the anode of diode 100 so as to neutralize these capacitance values and increase the bandwidth operation for the amplifiers shown in FIG. 2.

When the input signal detected by photodetector 100 increases to a point where the circuit cannot properly amplify this signal, then voltage is applied at $V_2$ to cause the Schottky diode 104 to turn on. As a result, load resistance 106 is brought into circuit in parallel with load resistance 112. Since load resistance 106 is considerably less than that of load resistance 112, the effective load impedance will be approximately equal to that of impedance 106. Since resistor 112 preferably has resistance in the order of 100 kilohms and resistor 106 has a resistance in the order of 1 kilohm the overall signal gain reduction will be about 20 dB. Once resistor 106 is switched in circuit by diode 104 the biasing DC potential at the gate electrode of FET 110 increases which increases the biasing DC voltage provided to the anode of Zener diode 132. This results in the Zener diode entering a non-conducting mode and shutting off the transistor 128. This effectively prohibits the feedback of voltage across load resistance 112 converting the resistance 112 from a feedback resistance to a biasing resistance for diode 104. At this time the amplifier of FIG. 3 operates in a follower mode with reduced sensitivity or improved dynamic range.

It can be seen from the operation of the circuits shown in FIGS. 1, 2 and 3 that the amplifier has been provided where the overall gain or sensitivity of the amplifier can be decreased by switching the amplifier from a transimpedance amplifier into a follower inverting or non-inverting amplifier.

What I claim as new and desire to secure by Letters Patent of the United States is:

1. An amplifier, switchable between a broad bandwidth transimpedance mode and an improved dynamic range follower mode, for amplifying wave energy signals received and converted to electrical signals by a transducer comprising:
   first amplifier means having an input coupled to a junction between the transducer, a first transducer load impedance means and a second transducer load impedance means, the second load impedance being less than the first load impedance;
   second amplifier means coupled to the output of the first amplifier means and having its output coupled to the first load impedance means, said second amplifier means being operable in first and second modes respectively to provide voltage feedback to the input of the first amplifier through the first impedance means and to effectively reduce the voltage feedback to the input of the first amplifier means;
   switch means connected to said second load impedance means to switch said second load impedance means in and out of circuit with said transducer to effectively change the load impedance of said transducer and to respectively operate the second amplifier means in its first and second modes which respecitvely switches the amplifier between its transimpedance and follower modes of operation; and,
   output means coupled to the output of the first amplifier means to provide an output signal in response to the receipt of the wave energy signals by the transducer.

2. The amplifier of claim 1 wherein the second amplifier means has a bias applied thereto which is altered when the second impedance is switched into circuit to effectively switch the second amplifier into its second mode of operation reducing the voltage feedback to the first amplifier means.

3. The amplifier of claim 2 wherein the second amplifier means has a variable impedance circuit associated therewith and responsive to the bias voltage applied to the second amplifier means to alter the impedance of the variable impedance circuit and consequently changes the gain of the second amplifier means.

4. The amplifier of claim 1 wherein the output of the first amplifier means is positively coupled to the transducer.

5. The amplifier of claim 1 wherein the second amplifier means is turned off in its second mode of operation.

6. The amplifier of claim 1 wherein the second amplifier means has a gain which is controlled by the switch means to reduce the voltage feedback, and the output means is coupled to the output of the first amplifier means via the second amplifier means.

7. An amplifier, switchable between a broad bandwidth transimpedance mode and an improved dynamic range follower mode, for amplifying wave energy signals comprising:
   a field effect semiconductor device having a gate, drain, and source electrode, said device operating in a stable state at a gain approaching unity;
   a transducer for generating an electrical current in response to receipt of said wave energy, one end thereof being coupled to said gate electrode and the other end thereof being coupled to a transducer biasing potential;
   a negative feedback amplifier coupled to the source electrode of said device, said feedback amplifier being operable in a first mode to generate a negative feedback voltage in response to the electrical current of said transducer and being operable in a second mode to effectively reduce the negative feedback voltage;
   a first transducer load impedance coupled between the gate electrode of said device and the negative feedback amplifier;
   a second transducer load impedance coupled at one end to the gate electrode of said device, said second load impedance being connected at its other end to a biasing potential, said second transducer load impedance being less than the first transducer load impedance;
   switching means associated with said second load impedance to effectively switch said second load impedance in and out of circuit with the gate electrode of said device to change the load impedance of the transducer, the bias voltage of the negative feedback amplifier to respectively operate the negative feedback amplifier in its first and second modes which switches the amplifier respectively between its transimpedance and follower modes; and,
   output buffer means coupled to the source electrode of said device for providing an output signal in response to the receipt of said wave energy by said transducer.

8. The amplifier of claim 7 wherein the second transducer load impedance is considerably less than the first transducer load impedahce.

9. The amplifier of claim 7 wherein the negative feedback amplifier comprises a transistor having its base coupled to the source electrode of said device and its collector coupled to the first transducer load impedance, the transistor turning off in the second mode of operation precluding the negative feedback voltage.

10. The amplifier of claim 9 wherein the transistor has a Zener diode connected between the base of the transistor and the drain electrode of the device, the Zener diode operable between a conducting and non-conducting mode in response to changes in the bias voltage to switch the negative feedback amplifier between its first and second modes.

11. The amplifier of claim 7 wherein the negative feedback amplifier has a variable impedance circuit associated therewith responsive to the change in bias voltage to control the mode of operation of the negative feedback amplifier.

12. The amplifier of claim 7 wherein the negative feedback amplifier comprises a transistor having its base coupled to the source electrode of said device and its collector coupled to the first transducer load impedance and the output of the amplifier.

13. The amplifier of claim 12 wherein the collector of the feedback transistor has a resistance element coupled thereto, and the emitter of the feedback transistor has a variable impedance circuit connected thereto, the impedance circuit comprises a first resistance connected in parallel with an impedance branch between the emmiter of the feedback transistor and a voltage supply, the impedance branch includes a first diode having its anode connected to a junction of a second resistance connected to the voltage supply and an anode of a first diode of a series pair of diodes oriented in the same direction with the cathode of the second diode of the series pair connected to ground, said first diode operable between conducting and non-conducting modes responsive to the bias voltage applied to the feedback transistor to change the effective impedance of the impedance branch and thereby change the mode of operation of the feedback amplifier.

14. The amplifier of claim 13 further including a third resistance connected in series with the first diode.

15. The amplifier of claim 7 wherein the other end of the transducer is coupled to the source and drain electrode of the device.

16. The amplifier of claim 15 further including a second transistor in circuit between the other end of the transducer and the source electrode of the device, the second transistor having its base connected to the source electrode and its emmiter connected to the other end of the transducer.

* * * * *